(12) United States Patent
Lenoble

(10) Patent No.: US 7,612,420 B2
(45) Date of Patent: Nov. 3, 2009

(54) METHOD FOR DOPING A FIN-BASED SEMICONDUCTOR DEVICE

(75) Inventor: Damien Lenoble, Ixelles (BE)

(73) Assignees: IMEC, Leuven (BE); STMicroelectronics (Croelles2) SAS, Croelles Cedex (FR)

( * ) Notice: Subject to any disclaimer, the term of this patent is extended or adjusted under 35 U.S.C. 154(b) by 153 days.

(21) Appl. No.: 11/843,569

(22) Filed: Aug. 22, 2007

(65) Prior Publication Data

US 2008/0048273 A1 Feb. 28, 2008

(30) Foreign Application Priority Data

Aug. 23, 2006 (EP) .................. 06119426

(51) Int. Cl.
*H01L 27/088* (2006.01)
*H01L 21/76* (2006.01)

(52) U.S. Cl. ...................... 257/401; 438/525
(58) Field of Classification Search .......... 438/524, 438/525, 536; 257/391, 622
See application file for complete search history.

(56) References Cited

U.S. PATENT DOCUMENTS

| 5,290,358 | A | * | 3/1994 | Rubloff et al. | ............... | 118/715 |
|---|---|---|---|---|---|---|
| 5,760,461 | A | * | 6/1998 | Cronin et al. | ............... | 257/622 |
| 2004/0108545 | A1 | * | 6/2004 | Ando | ................... | 257/329 |
| 2004/0217433 | A1 | * | 11/2004 | Yeo et al. | .................... | 257/412 |
| 2006/0175667 | A1 | * | 8/2006 | Tsuchiaki | ................... | 257/391 |
| 2006/0208204 | A1 | * | 9/2006 | Gupta et al. | ........... | 250/492.21 |

FOREIGN PATENT DOCUMENTS

EP 0234244 A2 2/1987

OTHER PUBLICATIONS

European Search Report dated Oct. 27, 2006 for European Application No. 06119426.2.
Lenoble D et al: "The junction challenges in the FinFETs device" Extended Abstracts of the Sixth International Workshop on Junction Technology (IEEE Cat. No. 06EX1256C), May 15-16, 2006, Shanghai, China, May 2006, pp. 78-83, XP002404821 IEEE Piscataway, NJ, USA ISBN: 1-4244-0048-1.
Okano K et al: "Process integration technology and device characteristics of CMOS FinFET on bulk silicon substrate with sub-10 nm fin width and 20 nm gate length" International Electron Devices Meeting 2005 (IEEE Cat. No. 05CH37703C), Dec. 5-7, 2005, Washington, DC, USA, 2005, p. 4 pp., XP002404822 IEEE Piscataway, NJ, USA ISBN: 0-7803-9268-X.

* cited by examiner

*Primary Examiner*—Kiesha L Rose
*Assistant Examiner*—Antonio B Crite
(74) *Attorney, Agent, or Firm*—Knobbe Martens Olsen & Bear LLP

(57) ABSTRACT

A method for doping a fin-based semiconductor device is disclosed. In one aspect, the method comprises patterning at least one fin, each fin comprising a top surface and a left sidewall surface and a right sidewall surface. The method further comprises providing a first target surface being the right sidewall of a first block of material. The method further comprises scanning a first primary ion beam impinging on the first target surface with an incident angle α different from zero degrees and thereby inducing a first secondary ion beam, and doping at least the left sidewall surface and possibly the top surface of the fin opposite to the first target surface with the first secondary ion beam.

20 Claims, 10 Drawing Sheets

METHOD FOR DOPING A FIN-BASED SEMICONDUCTOR DEVICE

BACKGROUND OF THE INVENTION

1. Field of the Invention

The present invention generally relates to semiconductor devices and more particularly to a method for doping fin-based semiconductor devices by using ion implantation.

2. Description of the Related Technology

Scaling down of silicon MOS devices has become a major challenge in the semiconductor industry. Whereas at the beginning, device geometrical shrinking already gave a lot of improvements in IC performance, nowadays new techniques, methods, materials and device architectures have to be introduced beyond the 90 nm technology node.

One major problem when scaling conventional planar devices are the short channel effects which start to dominate over the device performance. A solution for this problem came with the introduction of the multi-gate field effect transistor (MUGFET), also often referred to as fin-based semiconductor device or FINFET. Due to their three dimensional architecture, with the gate wrapped around a thin semiconductor fin, an improved gate control (and thus less short channel effects) over the channel could be achieved by using multiple gates.

An important issue for the fabrication of these MUGFETs is the uniform doping of the source-drain extensions. For conventional planar devices source-drain extensions can easily be performed by doing ion implantation. In this way source-drain regions can be made in the plane of the wafer surface. For MUGFETs however the doping of the source-drain extensions has to be done in a three dimensional way. More particularly doping of the top surface and doping of the sidewall surfaces of the fin is necessary. This is typically done by applying two ion implantation steps, as also described in U.S. Patent application US2004/0217433. In a first step dopant ions are implanted at a tilt angle α with respect to the normal of the top surface of the semiconductor fin in order to dope the left (first) sidewall surface and the top surface. In a second step dopant ions are implanted at a tilt angle -α with respect to the normal of the top surface of the semiconductor fin in order to dope the right (second) sidewall surface and the top surface. Due to the use of a focus beam with a good control of the tilt angle α of the incoming ion, the distribution of the implanted dose at the top of the fin versus the implanted dose at the sidewalls of the fin is always non-uniform. In addition the equivalent energy is different on the top and on the side of the fin since a tilt angle different from 45 degrees is used. More particularly, with the method as described in U.S. Patent application US2004/0217433 the top surface of the fin will receive twice the dose compared to the dose received at the sidewalls of the fin. More specifically, the sheet resistance ratio, which is the sheet resistance at the top surface versus the sheet resistance at the sidewall surfaces, is 2:1. This results in source-drain extension junctions which are not uniform (or conformal) all along the fin. This is not optimal for the device performance and short channel effect control. To have uniform doping a sheet resistance ratio close to 1 is required.

Furthermore for 32 nm high density circuits, these extension implantations are limited to an angle smaller than 10 degrees, which makes it again more difficult to get a uniform doping profile all along the fin.

It is thus desirable to provide a method for doping a multi-gate device that overcomes the drawbacks as described above. More specifically it is desirable to provide a method for doping a multi-gate device such that the sheet resistance ratio at the top surface to the sidewall surfaces is close to 1.

SUMMARY OF CERTAIN INVENTIVE ASPECTS

A method according to a first aspect of the present invention is disclosed for doping a fin-based semiconductor device comprising patterning at least one fin, the fin comprising a top surface and a first (left) sidewall surface and a second (right) sidewall surface, providing a first target surface being the sidewall of a first block of material facing the first sidewall surface of the fin, the first block of material having defined height, width and length, scanning a first primary ion beam impinging on the first target surface with a first incident angle (α) different from zero degrees and thereby inducing a first secondary ion beam, and doping at least the first sidewall surface, and possibly the top surface of the fin, facing the first target surface with the first secondary ion beam.

In one embodiment of the first aspect of the present invention a second target surface is provided. The second target surface is the opposite sidewall of a second block of material and is located opposite to the second sidewall surface of the fin. The second block of material has defined height, width and length such that the top surface of the fin is (completely) shadowed from the primary beam.

A method for doping a fin-based semiconductor device according to any of the foregoing embodiments of the first aspect is disclosed further comprising scanning a second primary ion beam impinging on the second target surface with a second incident angle different from zero degrees, preferably opposite and equivalent to the first incident angle and thereby inducing a second secondary ion beam wherein the first block of material having the height, width and length is such that the top surface of the fin is (completely) shadowed from the second primary beam and doping the second sidewall surface, and possibly the top surface of the fin, facing the second target surface with the second secondary ion beam.

A method according to any of the foregoing embodiments of the first aspect is disclosed wherein the first target surface is located at a distance in the approximate range of 5 nm to 50 nm, in the approximate range of 5 nm to 25 nm to the first sidewall surface of the fin and wherein the second target surface is located at a distance in the approximate range of 5 nm to 50 nm, in the approximate range of 5 nm to 25 nm to the second sidewall surface of the fin. Preferably, these distances are equal.

A method according to any of the foregoing embodiments of the first aspect is disclosed wherein the first and second incident angles (α) and (-α) are selected such that the primary ion beams do not impinge on the top surface of the fin. Preferably the incident angles are within the range of about 10 degrees to about 80 degrees, 10 degrees to 30 degrees, 30 degrees to 50 degrees, 50 degrees to 80 degrees with respect to the normal of the top surface of the fin. More specifically the incident angles are around 45 degrees with respect to the normal of the top surface of the fin.

A method according to any of the foregoing embodiments of the first aspect is disclosed wherein the incident angles are determined by the height of the block of material by the following formula:

$$\text{Tan}(90-\alpha) = (\text{height of the block of material} - \text{height of the fin})/(\text{width of the fin} + \text{distance between the fin and the target surface})$$

The material of the block of material can be doped or undoped.

A method according to any of the foregoing embodiments of the first aspect is disclosed wherein the ions of the primary ion beams, impinging on the undoped block of material, comprise doped ions and induce the secondary ion beams comprising backscattered doped ions.

In one embodiment of the present invention the ions of the primary ion beams impinging on the doped block of material induce the secondary ion beam comprising sputtered doped ions.

A method according to any of the foregoing embodiments of the first aspect is disclosed wherein the patterning of at least one fin further comprises providing a sequence or array of at least a first fin located at fin pitch from at least a second fin.

A method according to any of the foregoing embodiments of the first aspect is disclosed wherein the block of material is positioned in between the at least first fin and the at least second fin.

A method according to any of the foregoing embodiments of the first aspect is disclosed wherein a block of material is positioned over the at least second fin, thereby overlapping the fin and creating an alternate sequence of blocks of material and fins.

According to a second aspect of the present invention a multi-gate device is disclosed comprising a substrate, a fin comprising at least two sidewall surfaces and a top surface, a gate dielectric and gate electrode wrapped around the fin, a source/drain extension implantation uniformly doped with ions from a secondary ion beam along the sidewall surfaces and top surface of the fin, the ions being at specific locations in the surface.

In one embodiment according to a second aspect of the present invention the specific location of the multi-gate device are the locations where the secondary ions from the secondary ion beam used to dope the fin have reached the substrate.

In another embodiment according to a second aspect of the present invention the specific locations are on the substrate at the position where no fin is available and where no block of material was deposited.

BRIEF DESCRIPTION OF THE DRAWINGS

All drawings are intended to illustrate some aspects and embodiments of the present invention. The drawings described are only schematic and are non-limiting.

DETAILED DESCRIPTION OF CERTAIN INVENTIVE EMBODIMENTS

Figure 1:
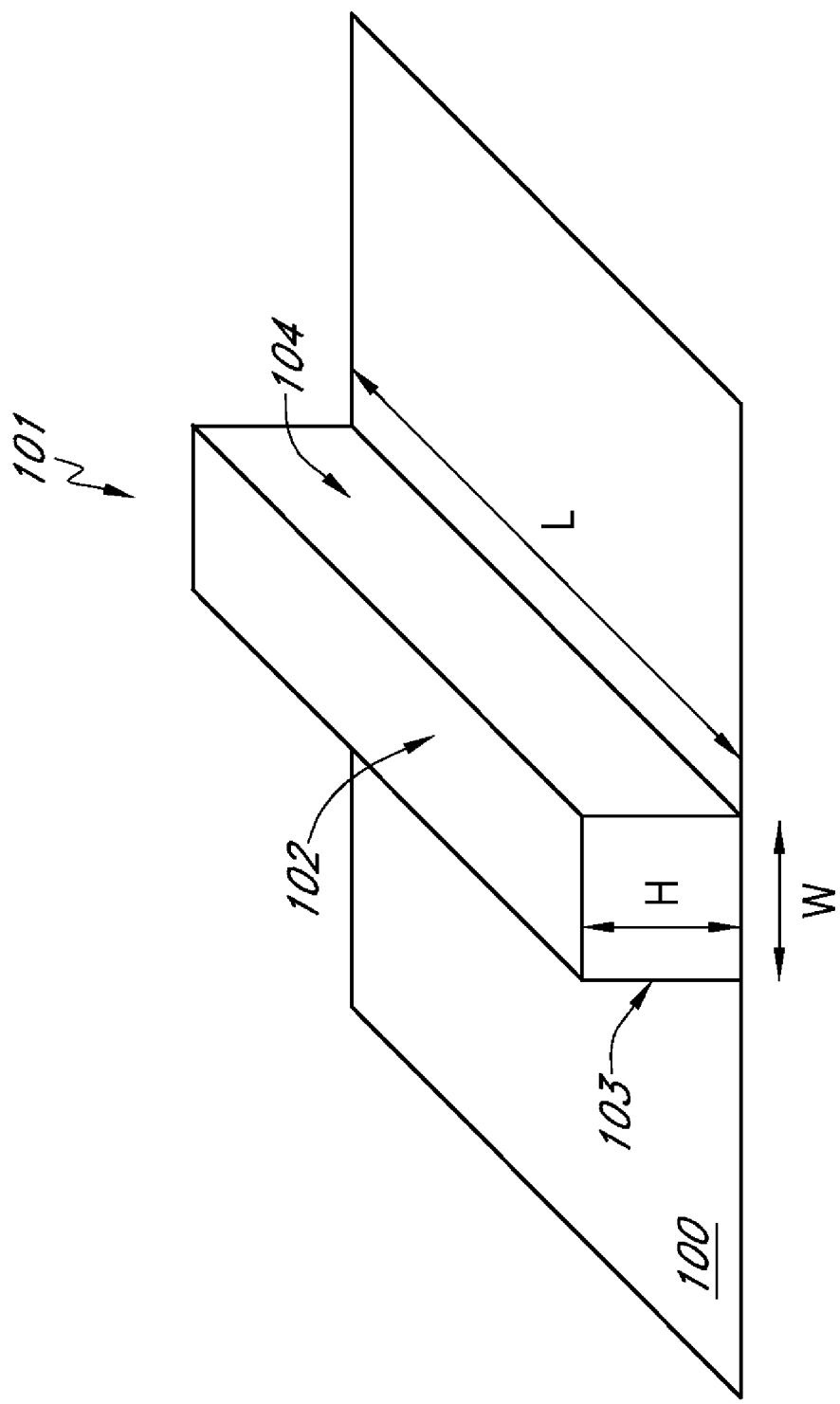
FIG. 1 is a schematic presentation of a fin and its geometrical properties.

One or more embodiments of the present invention will now be described in detail with reference to the attached figures, the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention. Those skilled in the art can recognize numerous variations and modifications of this invention that are encompassed by its scope. Accordingly, the description of preferred embodiments should not be deemed to limit the scope of the present invention.

Furthermore, the terms first, second and the like in the description and in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, left, right, over, under and the like in the description and the claims are used for descriptive purposes and not necessarily for describing relative positions. The terms so used are interchangeable under appropriate circumstances and the embodiments of the invention described herein can operate in other orientations than described or illustrated herein. For example "left" and "right" from an element indicates being located at opposite sides of this element.

It is to be noticed that the term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

The term target surface referred to in this application is used to define a surface upon which a primary ion beam is focused and from which a secondary ion beam is emitted. The ions of the primary and secondary beams can be the same or not.

Figure 2:
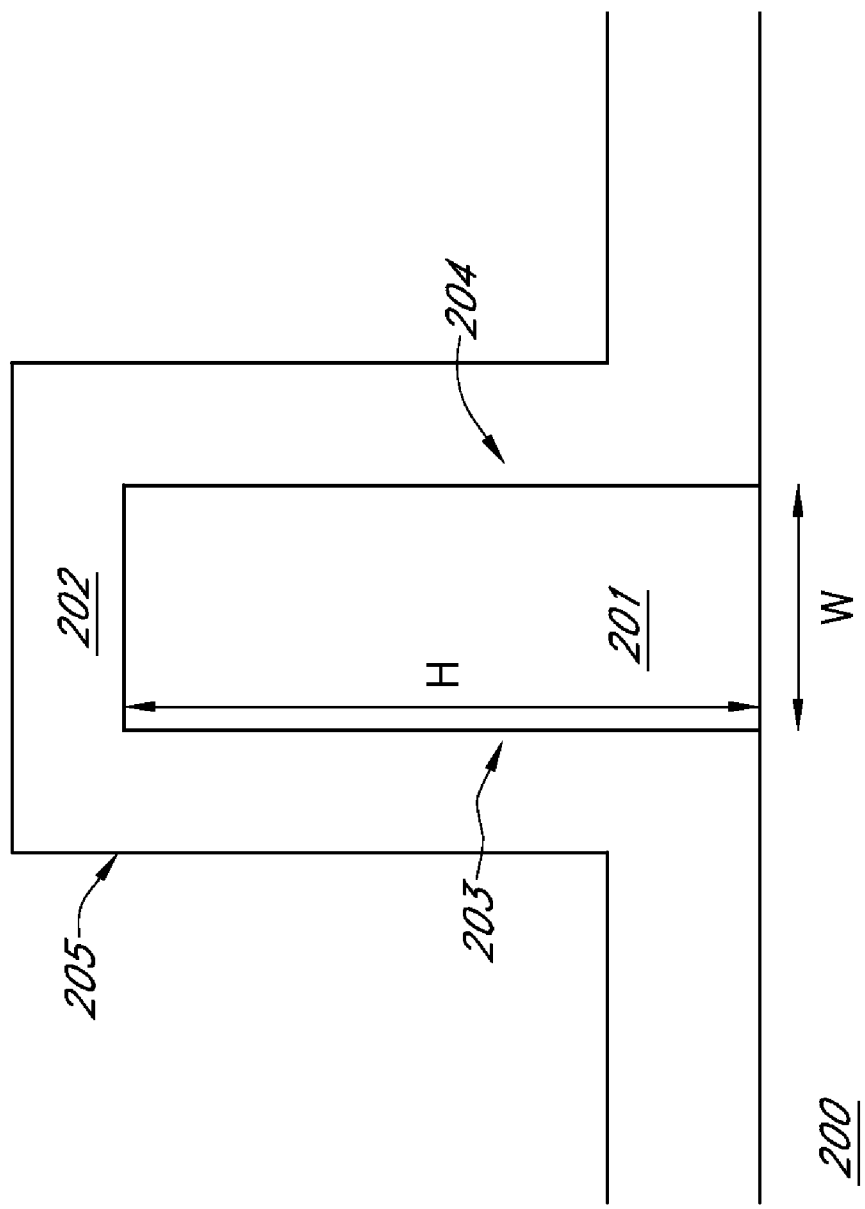
FIG. 2 represents a cross-sectional view of a multi-gate device.

A planar field effect transistor comprises a channel which is in the plane of the wafer surface and a gate which is located on top of this wafer surface in the same plane as the channel. One embodiment is related to multi-gate field effect transistors (MUGFET). For fabricating a multi-gate field effect transistor, a semiconductor material (e.g. Si, SiGe) is patterned to form a fin-like shaped body. Due to this fin-shaped body a multi-gate device is also often referred to as a finfet device. As described in FIGS. 1 and 2, the fin (101) is raised above the wafer/substrate surface (100). The fin (101) is determined by its width (W), height (H) and length (L) and comprises a top surface (102), a first (left) sidewall surface (103) and a second (right) sidewall surface (104). A gate dielectric and gate electrode (205) are wrapped around the channel region of the fin (201). Depending on the shape of the gate electrode, different types of multi-gate field effect transistors can be defined. A double-gate finfet is a multi-gate device where the gate only controls the conductivity of the two sidewall surfaces of the fin. Such a device is also often referred to as a double-gate device. An omega-gate finfet (Ω-gate finfet) is a multi-gate device where the gate controls the conductivity of the two sidewall surfaces (203,204) and the top surface (202) of the fin. A cross-sectional view of such an omega-gate finfet is shown in FIG. 2. A U-gate finfet is a multi-gate device where the gate controls the conductivity of the two sidewall surfaces and the bottom surface of the fin. A round-gate finfet is a multi-gate device where the gate controls the conductivity of the two sidewall surfaces, the top surface of the fin and the bottom surface of the fin.

A MUGFET can be fabricated on a silicon-on-insulator substrate (SOI). SOI substrates can be made in different ways, such as separation by implanted oxygen (IMOX) or wafer bonding. Also strained silicon-on-insulator substrates (SSOI) or relaxed $Si_{1-x}Ge_x$-on-insulator (SGOI) can be used. Alternatively a MUGFET can also be fabricated on bulk material and is then referred to as bulk MUGFET.

One embodiment provides a method for doping a fin-based semiconductor device comprising patterning at least one fin, the fin comprising a top surface and a left sidewall surface and a right sidewall surface, providing a first target surface being the right sidewall of a first block of material, the first block of material having a height, a width and a length, scanning a first primary ion beam impinging on the first target surface with an incident angle α different from zero degrees and thereby inducing a first secondary ion beam, and doping the left sidewall surface and the top surface of the fin opposite to the first target surface with the secondary ion beam.

In a first process of the method of one embodiment, at least one fin is patterned in the substrate by using a photolithographic process or by using spacer technology for patterning spacer defined fins. The fin (101) has a width (W), a height (H) and a length (L). The fin comprises a top surface (102) and two sidewall surfaces (103,104). More specifically a left sidewall surface (103) and a right sidewall surface (104) are defined. For example for a 32 nm technology node, the fin width is about 10 nM to 20 nm and the fin height is about 60 nm.

Figure 3:
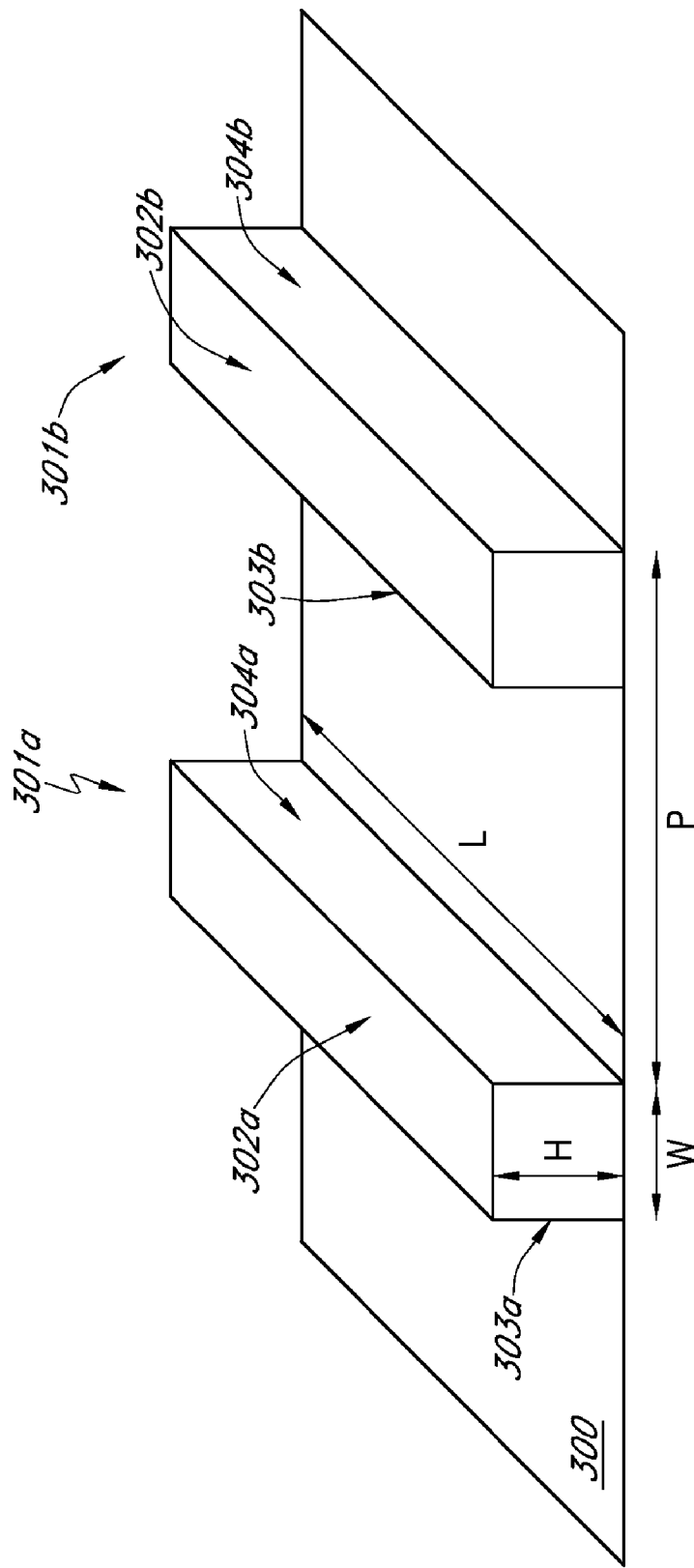
FIG. 3 is a schematic presentation of a plurality of fins and its geometrical properties.

In one embodiment of the present invention, as described in FIG. 3, a plurality of fins is patterned in the substrate by using a photolithographic process or by using spacer technology for patterning spacer defined fins. The plurality of fins comprises at least a first fin (301a) and at least a second fin (301b) separated by a fin pitch (P), meaning the spacing between successive fins. Each fin comprises a top surface (302) and a left sidewall surface (303) and a right sidewall surface (304). For example for a 32 nm technology node, the fin width is about 10 to 20 nm, the fin height is about 60 nm and the fin pitch is about 100 nm.

Figure 4:
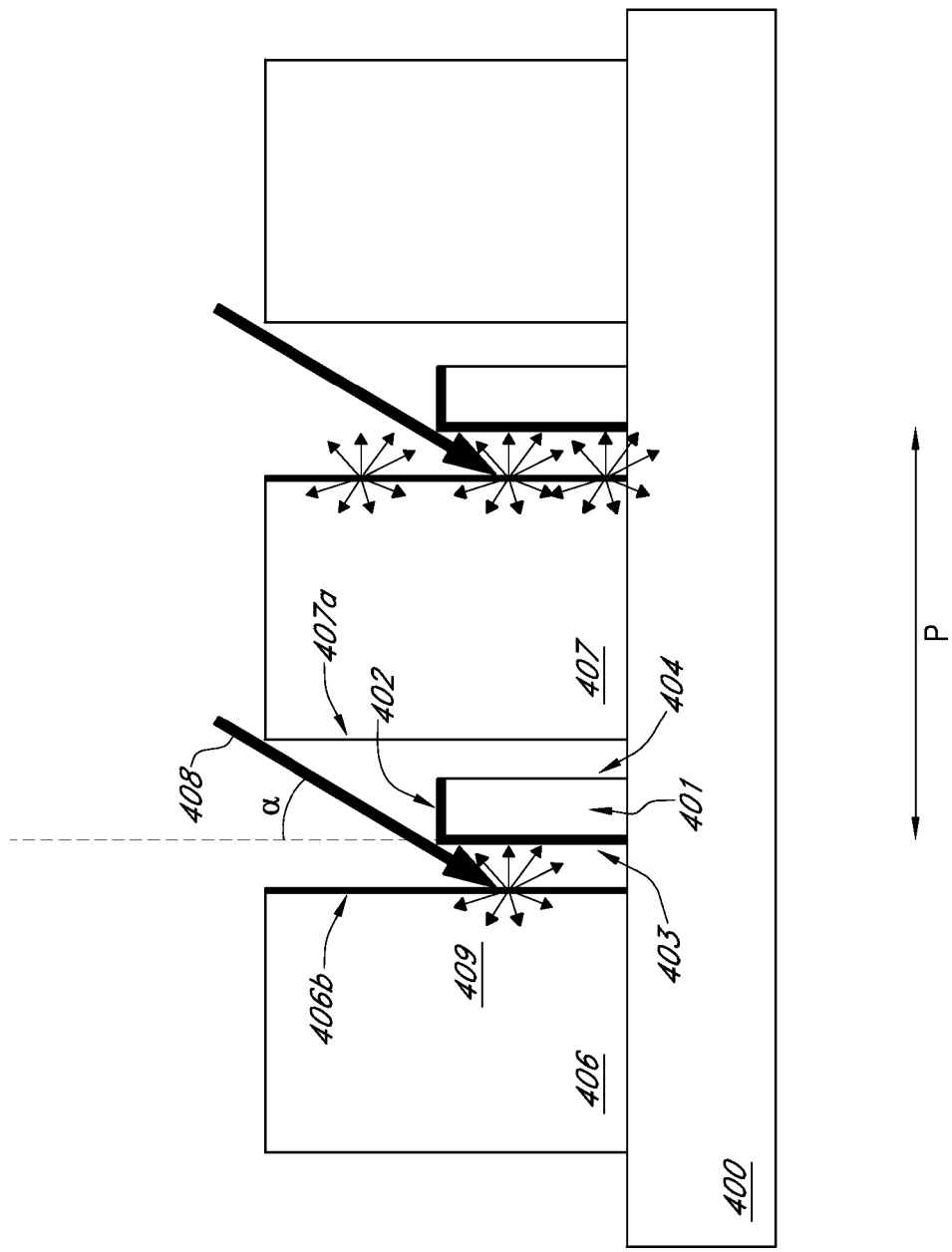
FIG. 4 shows a specific embodiment of the present invention to dope the left sidewall surface and the top surface of a plurality of fins.

In a second process of the method of one embodiment a first target surface is provided. This is also shown in FIG. 4. The first target surface (406b) is the right sidewall of a block of material (406). The target surface will act as the surface on which a primary ion beam (408) will impinge and is positioned parallel to the left sidewall surface (403) of the fin (401) at a distance different from 0 nm. The target surface has a height and a length which is equal to the height and the length of the block of material. The height of the block of material is more than the height of the fin. In case of a plurality of fins, the distance between the target surface and the sidewall surface of the fin is depending on the fin pitch P. The distance between the target surface and the sidewall surface of the fin is much smaller than the fin pitch and preferably in the approximate range of 5 nm to 50 nm. For example for a 32 nm technology node, the target surface may be placed at about 10 nm from the sidewall surface of the fin. The block of material comprising the target surface will have a width of about 80 nm.

The material of the block of material may be deposited by any standard deposition technique known for a person skilled in the art such as CVD, PECVD. After the deposition of the material the block of material is patterned by performing a lithographic process, which comprises illuminating, developing and etching.

In one embodiment of the present invention a second target surface (407a) is provided. The second target surface is the left sidewall of a second block of material (407) and is positioned opposite to the right sidewall surface (404) of the fin (401). The second block of material has a height, a width and a length such that the top surface of the fin is completely shadowed from the primary beam (408). This means that the primary ion (408) beam will not impinge on the top surface (402). This is also shown in FIG. 4.

In a third process of the method a first primary ion beam (408) is impinging and scanned on the first target surface (406a) with an incident angle α different from zero degrees and thereby inducing a first secondary ion beam (409). The incident angle α is chosen with respect to the normal of the top surface of the fin. It is important that the incident angle of the primary ion beam (408) is chosen so that the primary ion beam (408) does not impinge on the top surface (402) of the fin. The incident angle α is chosen preferably in the approximate range of 10 degrees to 80 degrees. After this process the left sidewall surface (403) as well as the top surface (402) of the fin (401) is doped with (part of) the ions of the secondary ion beam (409). The top surface (402) however is doped with a smaller portion, e.g. half the portion, of the ions of the secondary ion beam (409) compared to the left sidewall surface (403). This is because only the backscattered ions (409) generated on the first target surface (406a) at a height equal or higher than the height of the fin will contribute to the doping of the top surface (402).

Figure 5:
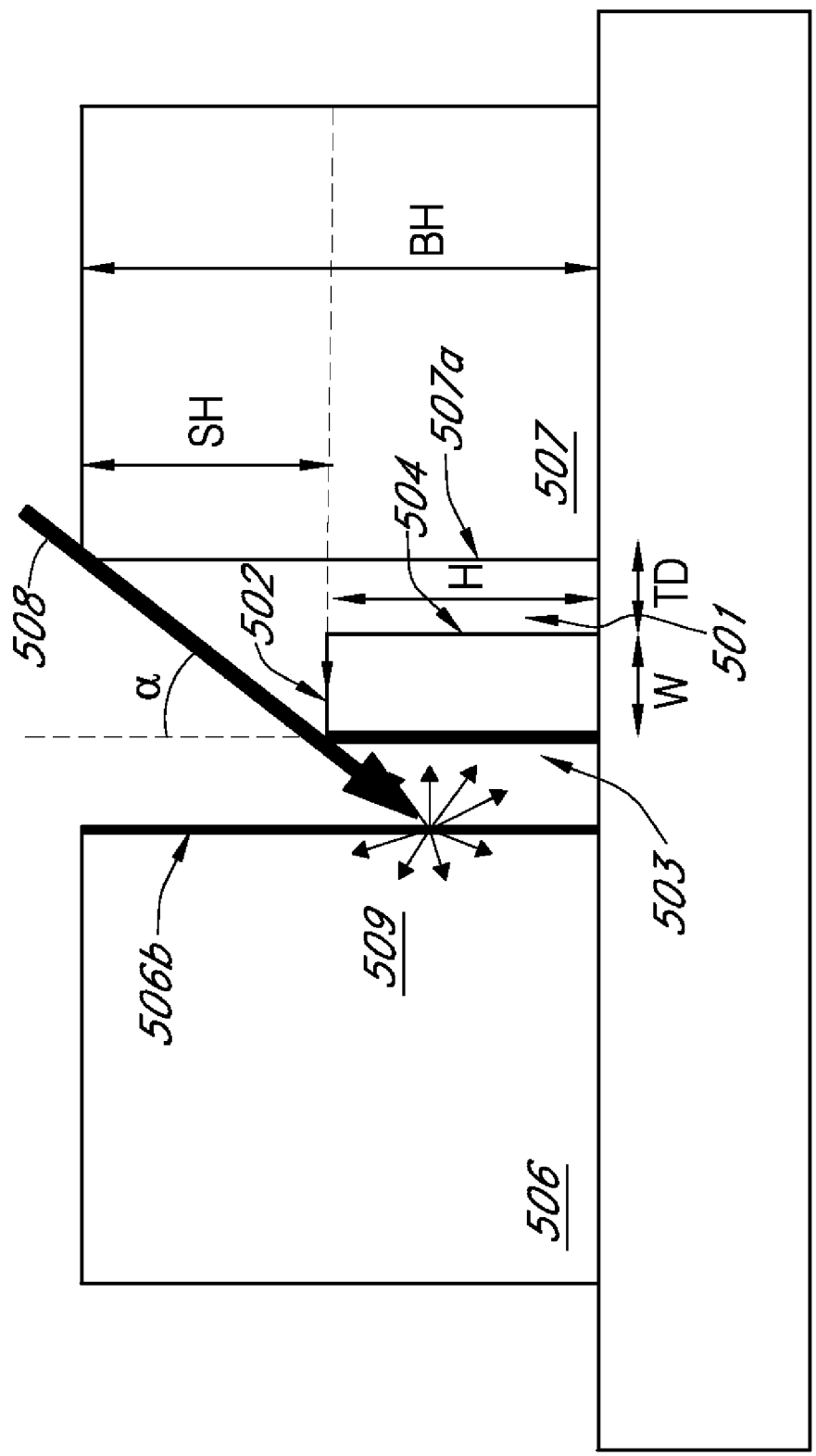
FIG. 5 shows a specific embodiment of the present invention to calculate the dependence between the incident angle of the primary ion beam and the height of the block of material which acts to shadow the fin.

The choice of the incident angle is also related to the height of the target surface (and thus the height of the block of material). In one embodiment the incident angle α is chosen so that the primary ion beam with the incident angle does not impinge on the top surface of the fin. The presence of the block of material (i.e. the height of the block of material and thus the height of the target surface, the distance between the target surface and the fin) shields or shadows the fin, this means is blocking the ions from the primary beam from reaching the top surface of the fin. This is also shown in FIG. 5. In order the shadow the fin (501), the height BH of the block of material (507), which will function as a shadowing block for the fin, must be higher than the height H of the fin (501). The height BH of the block of material (507) equals the sum of the height H of the fin and a supplementary shadow height SH necessary to shadow the fin. Based on the geometrical parameters, the following equation can be used to calculate the necessary incident angle α for a given shadow height SH, for a given fin width W, a given fin height H, a given distance TD between the fin sidewall surface and the target. Vice versa, from the same equation, the shadow height SH of the block of material can be calculated for a given incident angle α, a given fin width W, a given fin height H, a given distance TD between the fin sidewall surface and the target surface and a given shadow height SH of the target surface.

$$\tan(90-\alpha) = SH/(W+TD) \quad \text{(Equation 1)}$$

For example for a 32 nm technology node a fin width of about 20 nm may be used. The distance between the target surface and the sidewall surface of the fin is in the approximate range of 5 nm to 25 nm. Preferably an incident angle of, e.g., 45 degrees is used. Following the equation, the shadow height of the target surface to be will be in the range of 25 nm to 45 mm.

Figure 6:
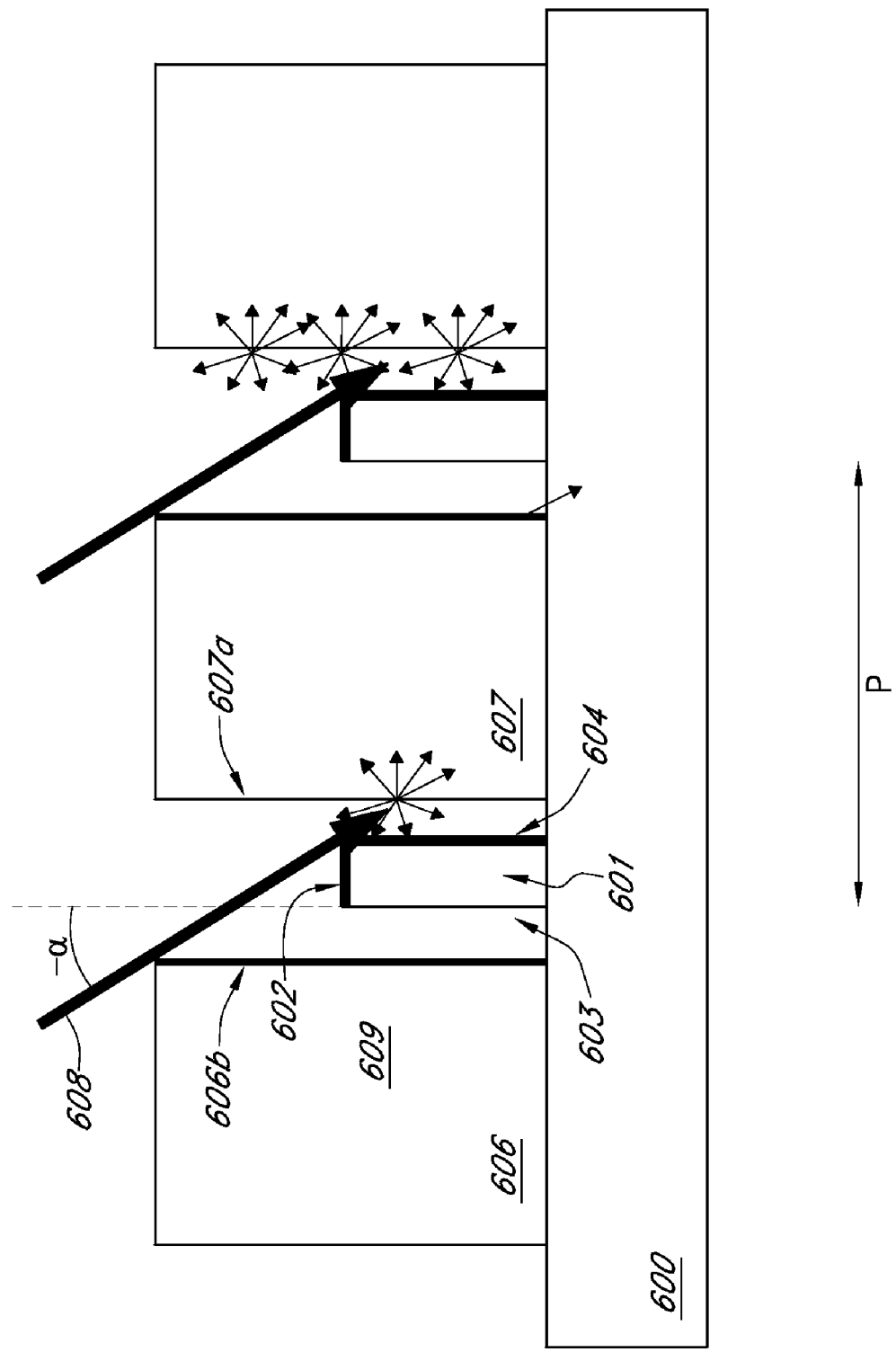
FIG. 6 shows a specific embodiment of the present invention to dope the right sidewall surface and the top surface of a plurality of fins.

In one embodiment of the present invention, as described in FIG. 6, the method further comprises a second primary beam (608) impinging and scanned on the second target surface (607a) with an incident angle −α different from zero degrees and thereby inducing a second secondary ion beam (609). The incident angle −α is chosen with respect to the normal of the top surface of the fin. In this case the first block of material having a height, a width and a length is used so that the top surface of the fin is completely shadowed from the second primary beam. In this process the right sidewall surface (604) and the top surface (602) of the fin opposite to the second target surface (607a) are doped by the second secondary ion beam (609). After this process the right sidewall surface (603) as well as the top surface (602) of the fin (601) is doped with part of the backscattered ions (609). The top surface (602) however is doped with a smaller portion, e.g. half the portion, of the backscattered ions (609) compared to the right sidewall surface (603). This is because only the backscattered ions (609) generated on the second target surface (607a) at a height equal or higher than the height of the fin will contribute to the doping of the top surface (602).

In one embodiment of the present invention the material of the block of material is selected to be undoped material or doped material. Depending on the material of the block of material the ion beam interaction at the target surface will be different. If the material is undoped, the undoped material can comprise, e.g., silicon nitride, oxide or any other undoped material known for a person skilled in the art. If the material is doped, the doped material can comprise e.g. boron, arsenic, phosphorus or any other doped material known for a person skilled in the art.

Figure 7:
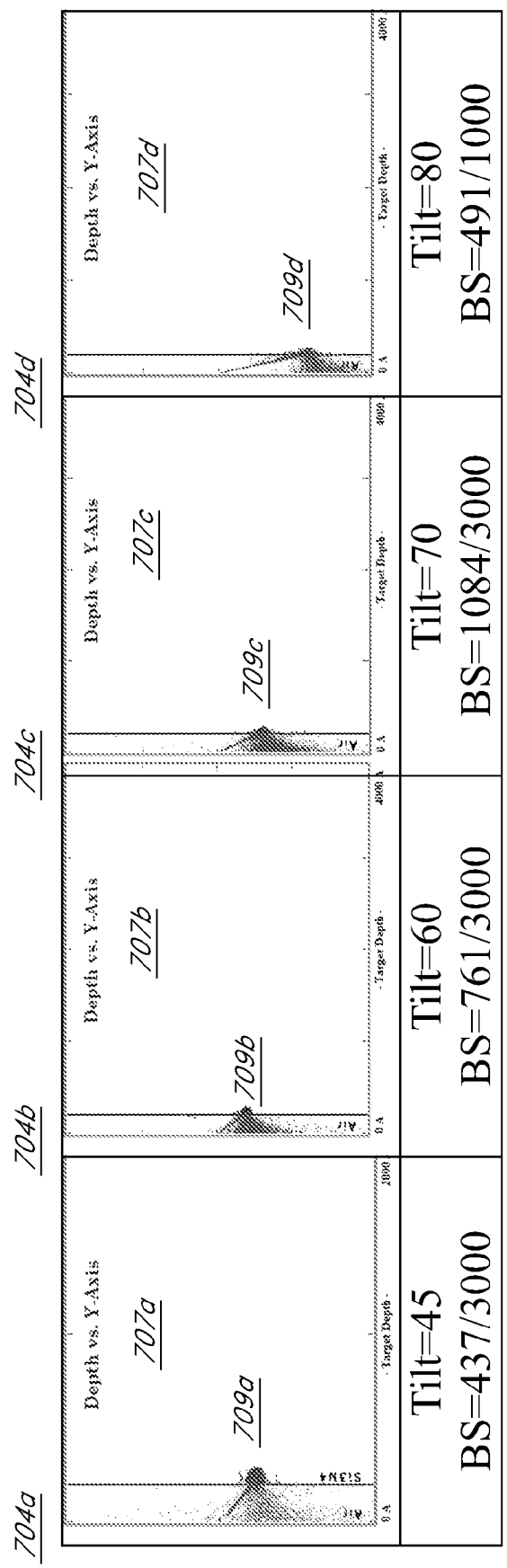
FIG. 7 shows the results from simulations done to compare different incident angles of the primary ion beam and the thereby induced backscattered ions.

In one embodiment the primary ion beam comprises n-type impurities (e.g. Arsenic, Phosphorus) or p-type impurities (e.g. Boron). The material of the block of material is undoped (e.g. nitride, oxide). When the primary beam impinges on the undoped target surface a secondary ion beam is generated comprising backscattered ions. The impurities of the secondary ion beam are similar to the impurities of the primary beam, e.g. if a primary beam with Arsenic impurities is used, the backscattered ion beam also comprises Arsenic impurities. The dose of impurities of the secondary backscattered ion beam is depending on the incident angle. Preferably an incident angle of 45 degrees is used. This has also been shown from simulation (see FIG. 7). In this simulation different tilt angles α were used, going from 45 degrees up to 80 degrees. When impinging 3000 ions on the target surface (707a) with an incident angle of 45 degrees 437 ions are backscattered (709a) towards the sidewall (704a) of the fin. Thus for an incident angle of 45 degrees, about 15% of backscattered ions reach the sidewall surface of the fin. The same simulation can be repeated for the other incident angles.

The sidewall surface of the fin which is positioned opposite to the target surface will be doped by the impurities of the secondary ion beam. Preferably the primary beam is scanned across the target surface. Due to this scanning of the primary beam also the backscattered ion beam is scanned across the sidewall surface of the fin inducing a uniform doping along the sidewall surface and the top surface of the fin.

In one embodiment the primary ion beam comprises neutral ions (e.g. any rare gas such as Xe, Ar) or doped ions (e.g. As, B, P). The material of the block of material is doped with n-type impurities (e.g. Arsenic, Phosphorus) or p-type impurities (e.g. Boron). When the primary beam impinges on the doped target surface, sputtering will occur and a secondary ion beam is generated comprising sputtered doped ions. The impurities of the secondary ion beam are similar to the impurities of the block of material, e.g. if a material with Arsenic impurities is used, the sputtered ion beam also comprises Arsenic impurities. The dose of impurities of the second sputtered ion beam is depending on the incident angle.

The sidewall surface of the fin which is positioned opposite to the target surface will be doped by the impurities of the secondary ion beam. Preferably the primary beam is scanned across the target surface. Due to this scanning of the primary beam also the sputtered ion beam is scanned across the sidewall surface of the fin inducing a uniform doping along the sidewall surface and the top surface of the fin.

The scanning direction of the primary ion beam on the target surface can occur in different directions, e.g. from left to right and from top to bottom, or from top to bottom and from left to right or any other combination which can easily be deduced by a person skilled in the art.

Figure 8:
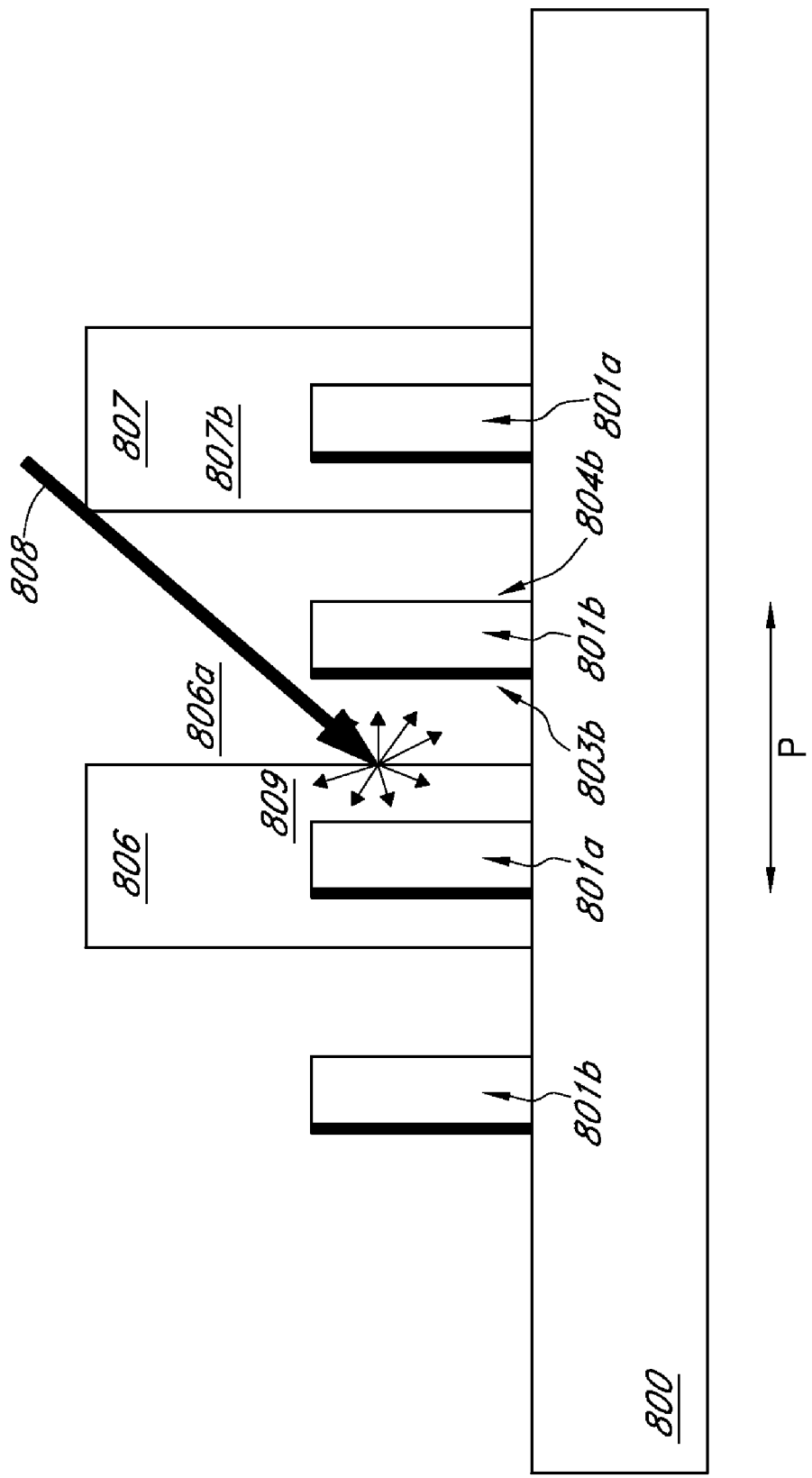
FIG. 8 shows a specific embodiment of the present invention to dope the right sidewall surface and the top surface of a plurality of fins.

In another embodiment of the present invention a plurality of fins is described in FIG. 8. In this plurality of fins a first array comprising at least one first fin (801a) and a second array comprising at least one second fin (801b) are defined. In this way the first and the second fin are alternating each other. The first fin and the second fin are positioned at a fin pitch from each other. A block of material (806) is positioned over the at least first fin (801a) of the first array, such that the at least second fin (801b) of the second array remains freestanding. The right sidewall (806a) of the block of material (806) acts as the left target surfaces to dope the left sidewall surface (803b) of the at least second fin (801b) of the second array. The left sidewall of the second block of material (807) acts as the right target surface (807b) to dope the right sidewall surface (804b) of the at least second fin (801b) of the second array. By using the alternating fins the first array comprising at least one first fin can be doped e.g. with n-type impurities and the second array comprising at least one second fin can be doped with p-type impurities.

The method of the foregoing embodiments can also be applied to, e.g., double gate devices where only the sidewall surfaces of the fin need to be doped. In this case a subsequent process is introduced to mask the top surface from any doping. By using a hardmask on top of the top surface one could prevent the secondary ion beam to reach the top surface. The hardmask material could be, e.g., nitride, oxide, or any other material which can block the secondary ions from doping the top surface.

The method of the foregoing embodiments can also be applied to any other application where the properties at the sidewall surface and the top surface of a vertical shape need to be altered. For example one could replace the fin by an oxide. The embodiments of the present invention thus allow e.g. to alter the dielectric properties of the sidewall surfaces and top surface of this vertical oxide layer by changing these properties by means of a secondary ion beam induced by a primary ion beam which impinges on a target surface positioned close by and parallel to the sidewall surface of the oxide layer.

Figure 9A:
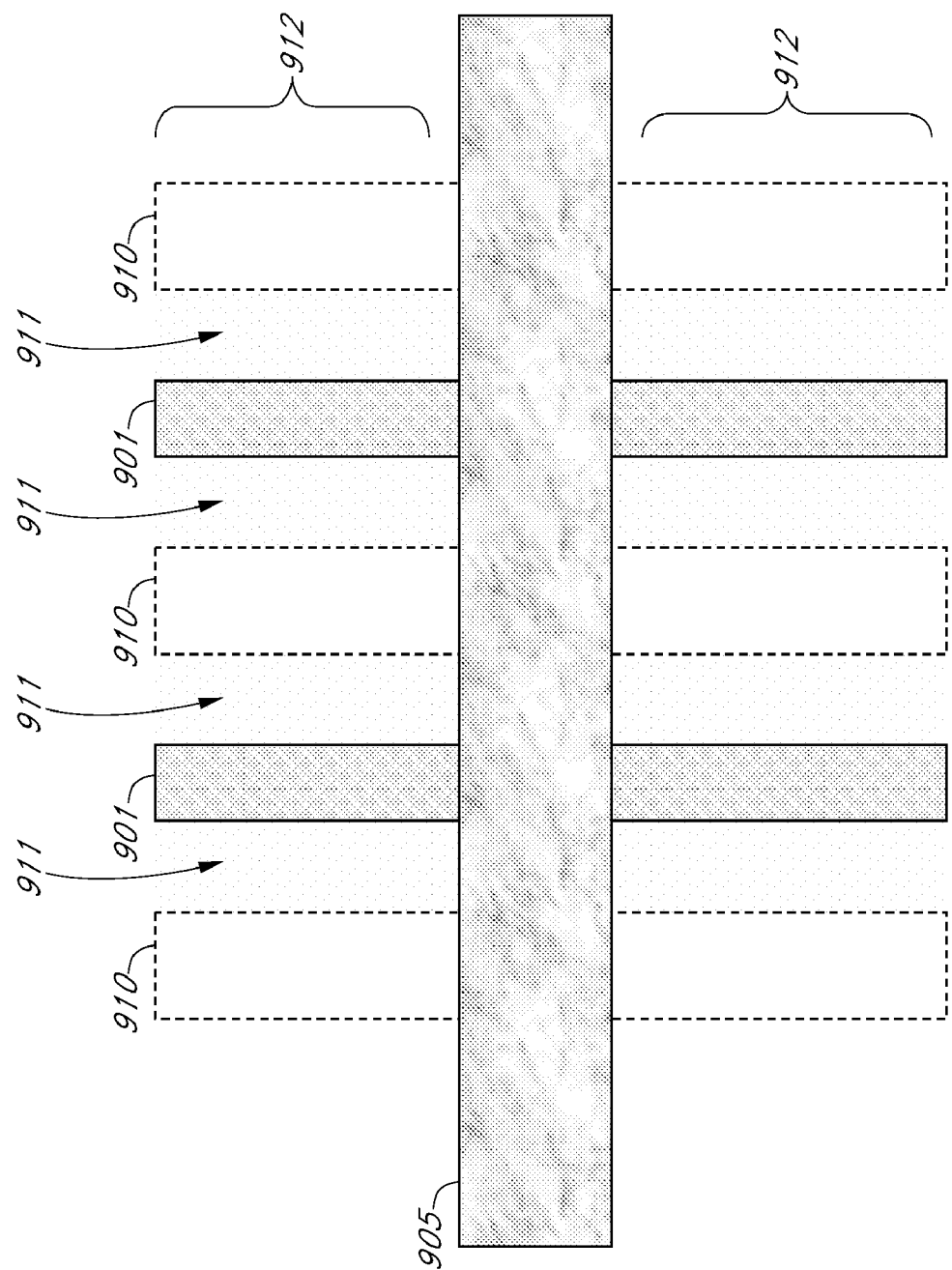
FIG. 9a shows a top view of a multi-gate device fabricated by a specific embodiment of the present invention.
Figure 9B:
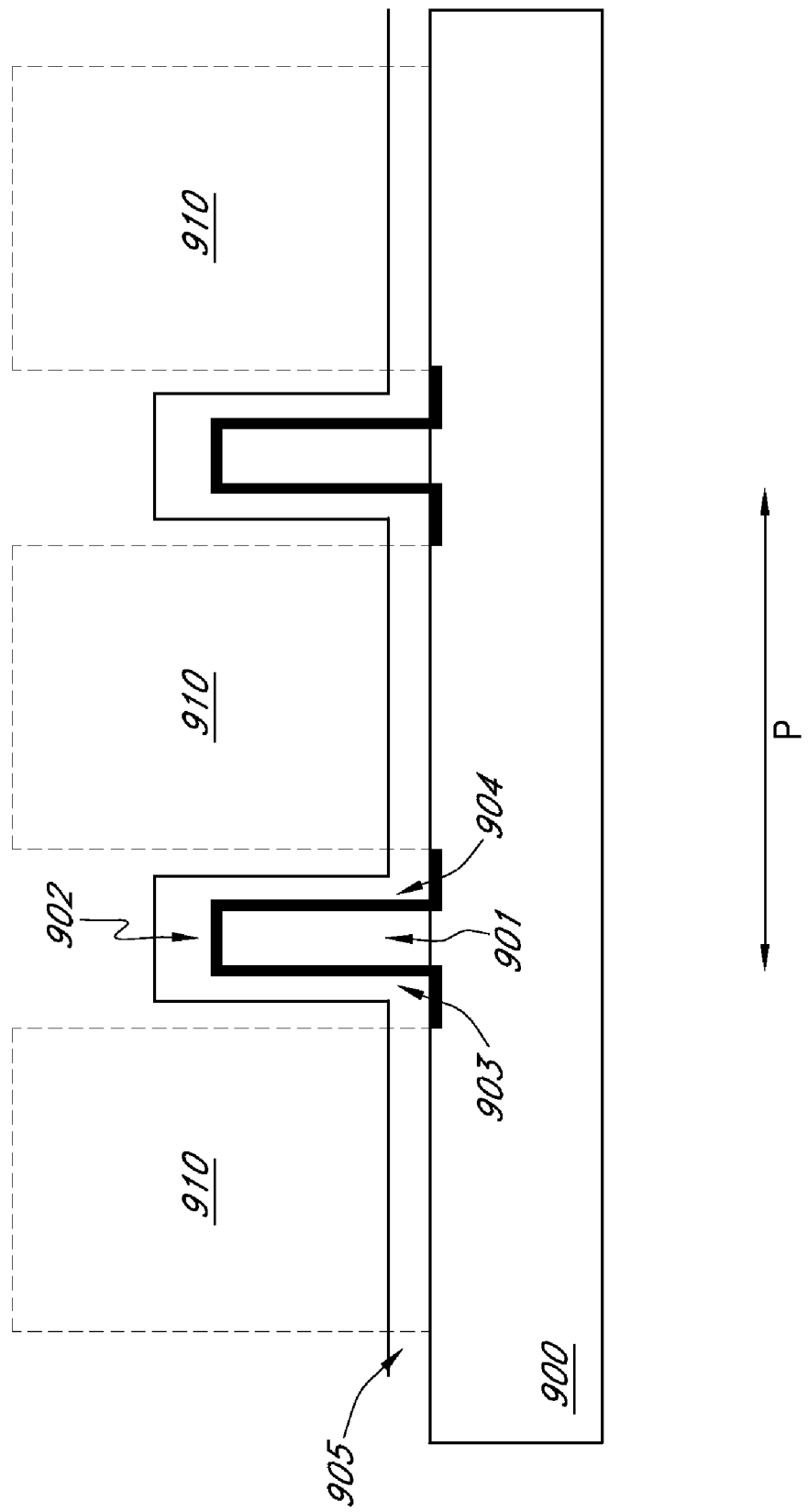
FIG. 9b shows a cross-sectional view of a multi-gate device fabricated by a specific embodiment of the present invention.

One embodiment also discloses a multi-gate device (top view image shown in FIG. 9a, cross-sectional view image shown in FIG. 9b) comprising at least one fin (901), the fin comprising a top surface (902), a left sidewall surface (903) and a right sidewall surface (904), comprising a gate dielectric and gate electrode (905) wrapped around the fin, comprising a source/drain extension implantation (912) in the fin which is uniformly doped along the sidewall surfaces and top surface of the fin with doped impurities and a substrate comprising the doped impurities at specific locations (911) where the secondary ion beam from the method could reach the substrate. The locations (911) where the secondary ion beam could reach the substrate are at the positions where no fin is available and where no block of material was deposited. At the positions on the substrate where a block of material (910) was deposited, no dopants will be detected. The presence of dopants can be checked by any doping profiling technique known by a person skilled in the art, such as f.e. SIMS, SSSRM.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of doping a fin-based semiconductor device comprising:
   providing at least one fin, the fin comprising a top surface and a first sidewall surface and a second sidewall surface;
   providing a first target surface being the sidewall of a first block of material facing the first sidewall surface of the fin,
   scanning a first primary ion beam impinging on the first target surface with a first incident angle different from zero degrees and thereby inducing a first secondary ion beam, doping at least the first sidewall surface with the first secondary ion beam.

2. The method according to claim 1, further comprising:
   providing a second target surface being the sidewall of a second block of material facing the second sidewall of the fin, the second block of material having defined height, width and length such that the top surface of the fin is substantially shadowed from the first primary beam.

3. The method according to claim 2, further comprising:
   scanning a second primary ion beam impinging on the second target surface with a second incident angle different from zero degrees, thereby inducing a second secondary ion beam wherein the first block of material having a height, width and length such that the top surface of the fin is substantially shadowed from the second primary beam, and thereby
   doping the second sidewall surface of the fin with the second secondary ion beam.

4. The method according to claim 2, wherein the first target surface is located at a distance approximately in the range of 5 nm to 50 nm to the first sidewall surface of the fin and wherein the second target surface is located at a distance approximately in the range of 5 nm to 50 nm to the second sidewall surface of the fin.

5. The method according to claim 2, wherein the first and second incident angles are selected such that the primary ion beams do not impinge on the top surface of the fin.

6. The method according to claim 5, wherein the incident angles are approximately within the range of about 10 degrees to about 80 degrees with respect to the normal of the top surface of the fin.

7. The method according to claim 6, wherein the incident angles are around 45 degrees with respect to the normal of the top surface of the fin.

8. The method according to claim 1, wherein the incident angle is determined by the height of the block of material by:

$$\mathrm{Tan}(90-\alpha) = (BH-H)/(W+TD),$$

wherein BH=the height of the block of material, H=the height of the fin, W=the width of the fin and TD=the distance between the fin and the target surface.

9. The method according to claim 2, wherein the material of the block of material is doped or undoped.

10. The method according to claim 9, wherein ions of the primary ion beam impinging on the undoped block of material comprises doped ions.

11. The method according to claim 10, wherein the secondary ion beam comprises backscattered doped ions.

12. The method according to claim 9, wherein the secondary ion beam comprising sputtered doped ions.

13. The method according to claim 1, wherein the providing of at least one fin further comprises providing a sequence or an array of fins comprising at least a first fin located at a fin pitch from a second fin.

14. The method according to claim 13, wherein the first block of material is positioned in between the first fin and the second fin.

15. The method according to claim 13, wherein the first block of material is positioned over the second fin.

16. A fin-based semiconductor device obtainable by a process comprising the method according to claim 1.

17. A method of doping a fin-based semiconductor device comprising:
   providing at least one fin, the fin comprising a top surface and a first sidewall surface and a second sidewall surface;
   providing a block of material with a sidewall facing the first sidewall surface of the fin, the sidewall of the block of material being a target surface; and
   impinging a primary ion beam on the target surface with an incident angle with respect to the normal of the top surface of the fin, the incident angle being different from zero degrees,
   wherein the primary ion beam, upon reaching the first target surface, scatters and generates a secondary ion beam, and at least a portion of the secondary ion beam dopes the first sidewall surface of the fin.

18. The method of claim 17, wherein a portion of the secondary ion beam dopes the top surface of the fin.

19. The method of claim 18, wherein the top surface of the fin is doped by a smaller portion of the secondary ion beam than the first sidewall wall surface of the fin.

20. The method of claim 17, wherein the primary ion beam does not impinge on the top surface of the fin.

* * * * *